United States Patent
Hochman et al.

(10) Patent No.: US 8,840,284 B1
(45) Date of Patent: Sep. 23, 2014

(54) MODULAR LIGHT EMITTING DISPLAYS AND ARRAYS OF SAME

(71) Applicant: Revolution Display, Inc., Glendale, CA (US)

(72) Inventors: Jeremy Hochman, Glendale, CA (US); Shane Monsees, Glendale, CA (US)

(73) Assignee: Revolution Display, Inc., Glendale, CA (US)

( * ) Notice: Subject to any disclaimer, the term of this patent is extended or adjusted under 35 U.S.C. 154(b) by 0 days.

(21) Appl. No.: 13/874,913

(22) Filed: May 1, 2013

(51) Int. Cl.
*H05K 7/12* (2006.01)

(52) U.S. Cl.
CPC ........................................ *H05K 7/12* (2013.01)
USPC .................. 362/391; 362/217.12; 362/249.02

(58) Field of Classification Search
USPC ............... 362/217.1, 217.12, 217.13, 217.16, 362/217.17, 219, 220, 225, 249.02, 391, 362/407, 648
See application file for complete search history.

(56) References Cited

U.S. PATENT DOCUMENTS

| | | | | |
|---|---|---|---|---|
| 8,057,077 | B2 * | 11/2011 | Gagne et al. | 362/404 |
| 2011/0122608 | A1 * | 5/2011 | Napier et al. | 362/184 |
| 2012/0182739 | A1 * | 7/2012 | Leung et al. | 362/249.06 |
| 2012/0188766 | A1 * | 7/2012 | Lu et al. | 362/249.02 |
| 2013/0100662 | A1 * | 4/2013 | Lin | 362/235 |

\* cited by examiner

*Primary Examiner* — Laura Tso
(74) *Attorney, Agent, or Firm* — Opticus IP Law PLLC (57) ABSTRACT

Disclosed is a modular light emitting display that includes a housing having a bottom, a top, a first pair of opposing sidewalls, a second pair of opposing sidewalls and a printed circuit board disposed inside the housing, with a plurality of light emitting elements connected to the printed circuit board. At least one connector extends outwardly from one of the sides of the first pair of sides, at least one reciprocal connector extends outwardly from the other of the side of the first pair of sides, the at least one connector and the at least one reciprocal connector spaced the same distance from second pair of opposing sides.

54 Claims, 12 Drawing Sheets

MODULAR LIGHT EMITTING DISPLAYS AND ARRAYS OF SAME

BACKGROUND

1. Field

This invention relates to the mechanical and electrical arts. In particular, it relates to a modular light emitting displays as well as arrays of such modular light emitting displays.

2. Background

Displays for entertainment, architectural, and advertising purposes have commonly been constructed from numbers of light emitting elements, such as light emitting diodes ("LEDs") mounted onto flat panels. The light emitting elements may be selectively turned on and off to create patterns, graphics, and video displays for both informational and aesthetic purposes. It is well known to construct these displays as tiles or large panels which are assembled in position for a specific event.

There is often a requirement at specific events, such as a concerts or trade shows, to use a display that can be easily constructed and then easily removed, for example, easily constructed at the beginning of an event, easily removed when the event ends and then easily transported to a new event.

A display apparatus constructed as a large panel or as a series of solid tiles bolted or permanently fixed together may be very difficult to use at such events. Such displays are typically large and heavy, and require abundant support machinery and time to construct and remove, as well as storage space between events. For example, as disclosed in U.S. Pat. No. 6,704,989, issued to Lutz, an electronic signal display system requires the individual display sections be lifted out of storage cases with a lifting truss and then joined and stacked appropriately for display.

Another requirement for display systems used for such events is for the display to be easily and quickly configurable to multiple sizes and shapes, thereby allowing the system to suit different installations and logistical constraints. However, LED tile systems generally require frames and ground support structures. For example, the light tile systems often use an extruded aluminum housing that must be attached to a metal frame of some sort. These frames may then be ground supported by an external structure to make use of rigging systems when creating LED tile systems of significant size. As such, these systems generally create an additional cost and tend to work against the goal of creating a transparent and light weight wall system.

Accordingly, there exists a definite need for light emitting displays that can be easily constructed at and removed from the site of an event, as well as conveniently stored between events. There exists a further definite need for a modular light emitting display that can be easily and quickly configured to multiple sizes and shapes.

SUMMARY OF THE INVENTION

Now there has been discovered a light emitting display that provides for these and related needs. In some aspects of the invention, a modular light emitting display comprises a housing having a bottom, a top, a first pair of opposing sidewalls and a second pair of opposing sidewalls, where each of the sidewalls of the first pair has substantially the same length as the other sidewall of the first pair and each of the sidewalls of the second pair has substantially the same length as the other sidewall of the second pair. In some embodiments, the housing has a substantially square or rectangular cross section. In some embodiments, the modular light emitting display comprises a shell having a cover and, in some embodiments, the cover is removable.

In some aspects, the housing includes at least one first support wire opening in one of the sidewalls of the second pair of sidewalls and at least one second support wire opening in the other sidewall of the second pair of sidewalls, where the at least one first support wire opening is aligned with the at least one second support wire opening. And in some aspects, the modular light emitting display includes a plurality of pairs of first and second support wire openings, where the first support wire openings are in one of the sidewalls of the second pair of sidewalls and the second support wire openings are in the other sidewall of the second pair of sidewalls and the first support wire opening of each pair is aligned with the second wire support opening of each pair.

In some aspects, the modular light emitting display includes at least one support wire fastener disposed inside the housing, and aligned with the at least one first support wire opening. And in some aspects, the modular light emitting display further includes a plurality of support wire fasteners disposed inside the housing, where each support wire fastener is aligned with a pair of support wire openings. In some embodiments, the support wire fastener is a support wire clamp.

In some aspects of the invention, the housing includes at least one connector extending outwardly from one of the sides of the first pair of sides. And in some aspects, the modular light emitting display further includes at least one reciprocal connector extending outwardly from the other of the side of the first pair of sides, the at least one connector and the at least one reciprocal connector spaced the same distance from second pair of opposing sides. In some aspects, the housing includes a plurality of connectors extending outwardly from one of the sides of the first pair of sides, the plurality of connectors spaced from one another along the one side, and an equal number of reciprocal connectors extending outwardly from the other of the side of the first pair of sides, where each connector has a corresponding reciprocal connector and each connector and corresponding reciprocal connector spaced equally from second pair of opposing sides. In some embodiments, each connector is a ball connector and each reciprocal connector is a socket connector.

In some aspects, the modular light emitting display further comprises at least one support wire channel extending from one sidewall of the second pair of opposing sidewalls to the opposing sidewall of the second pair of sidewalls, where the at least one wire support channel has a first end and a second end, the first end terminating at the at least one first support wire opening and the second end terminating at the at least one second support wire opening. And, in some aspects, the modular light emitting display further comprises a plurality of support wire channels, each support wire channel extending from one of the first support wire openings of a pair of support openings to the second support wire opening of the pair of support wire openings. In some embodiments, the at least one support wire fastener is disposed in the at least one support wire channel and, in some embodiment at least one of the support wire fasteners is disposed in each support wire channel.

In some aspects, the modular light emitting display further comprises at least one cable channel extending from one sidewall of the second pair of opposing sidewalls to the opposing sidewall of the second pair of sidewalls, the at least one cable channel having a first end and a second end, the first end terminating at a first cable opening and the second end terminating at a second cable opening.

And in some aspects the modular light emitting display comprises a printed circuit board having a top surface disposed inside the housing and a plurality of light emitting elements operably connected to the top surface of the printed circuit board, where the housing top has a hole aligned with each of the plurality of light emitting elements. In some embodiments, the printed circuit board is mounted on a printed circuit board base disposed in the housing. And in some embodiments, the at least one light emitting element is an LED, an LCD or an OLED.

In an aspect of the invention, an array is formed of at least two adjacent light emitting displays. Each light emitting display comprises a housing having a bottom, a top, a first pair of opposing sidewalls and a second pair of opposing sidewalls, where each of the sidewalls of the first pair has substantially the same length as the other sidewall of the first pair and each of the sidewalls of the second pair has substantially the same length as the other sidewall of the second pair.

In an aspect, each modular light emitting display includes at least one first support wire opening in one of the sidewalls of the second pair of sidewalls and at least one second support wire opening in the other sidewall of the second pair of sidewalls, where the at least one first support wire opening is aligned with the at least one second support wire opening.

In another aspect, at least one support wire extends through the at least one first support wire opening and the at least second wire opening in each light emitting display, where the at least one support wire secures adjacent light emitting displays. And in one aspect, the light emitting displays are movable between collapsed and open positions.

BRIEF DESCRIPTION OF THE DRAWINGS

The accompanying drawings, together with the specification, illustrate exemplary embodiments, and, together with the description, serve to explain the principles of these embodiments.

DETAILED DESCRIPTION OF THE PREFERRED EMBODIMENTS

Particular embodiments of the invention are described below in detail for the purpose of illustrating its principles and operation. However, various modifications may be made, and the scope of the invention is not limited to the exemplary embodiments described below.

Figure 1:
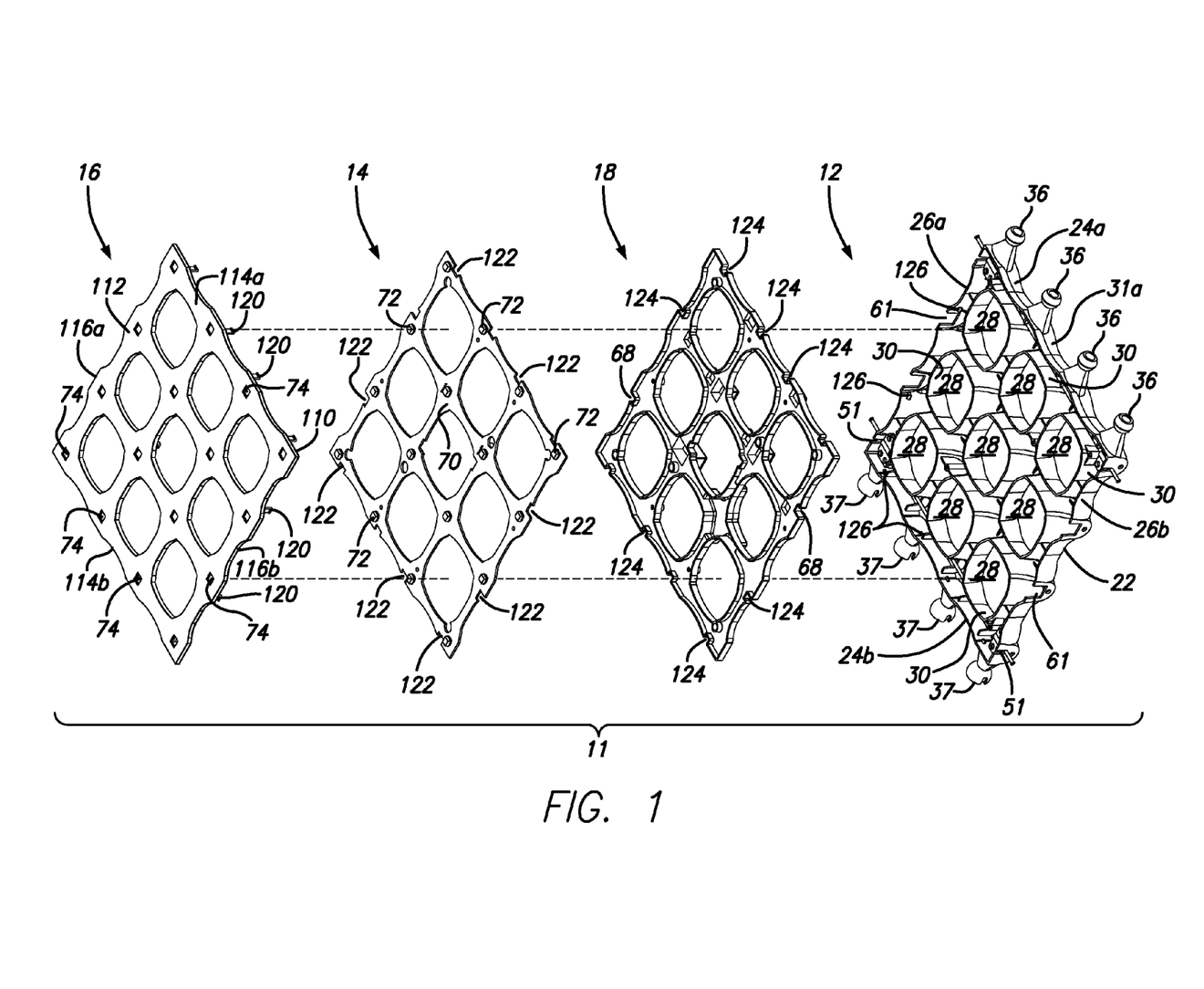
FIG. 1 is an exploded, front perspective view of a modular light emitting display in accordance with one aspect of the invention.

Shown in FIG. 1 is an exploded, front perspective view of a modular light emitting display 11 in accordance with one aspect of the invention. The embodiment shown in FIG. 1 includes a housing having a bottom, a top, a first pair of opposing sides and a second pair of opposing sides. The housing can have any suitable cross section, such as a polygonal cross section, including a square or rectangular cross section. In the representative embodiment shown in FIG. 1, the housing has a substantially square cross section. In some embodiments, the housing has a cross section of from about 2 inches to about 12 inches by from about 2 inches to about 12 inches and some embodiments from about 3 inches to about 9 inches by from about 3 inches to about 9 inches and in some embodiments a cross section of from about 4 inches to about 6 inches by from about 4 inches to about 6 inches.

In the representative embodiment shown in FIG. 1, the housing is formed of a shell 12 and a cover 16, with a printed circuit board ("PCB") 14 disposed in the housing. In some aspects, the PCB board is mounted on a PCB base 18 disposed in the housing. The shell, the cover and the PCB base are made of any suitable material. In some embodiments, they are made of an engineering plastic such as acrylonitrile butadiene, styrene, polycarbonate or polyamide.

Figure 2:
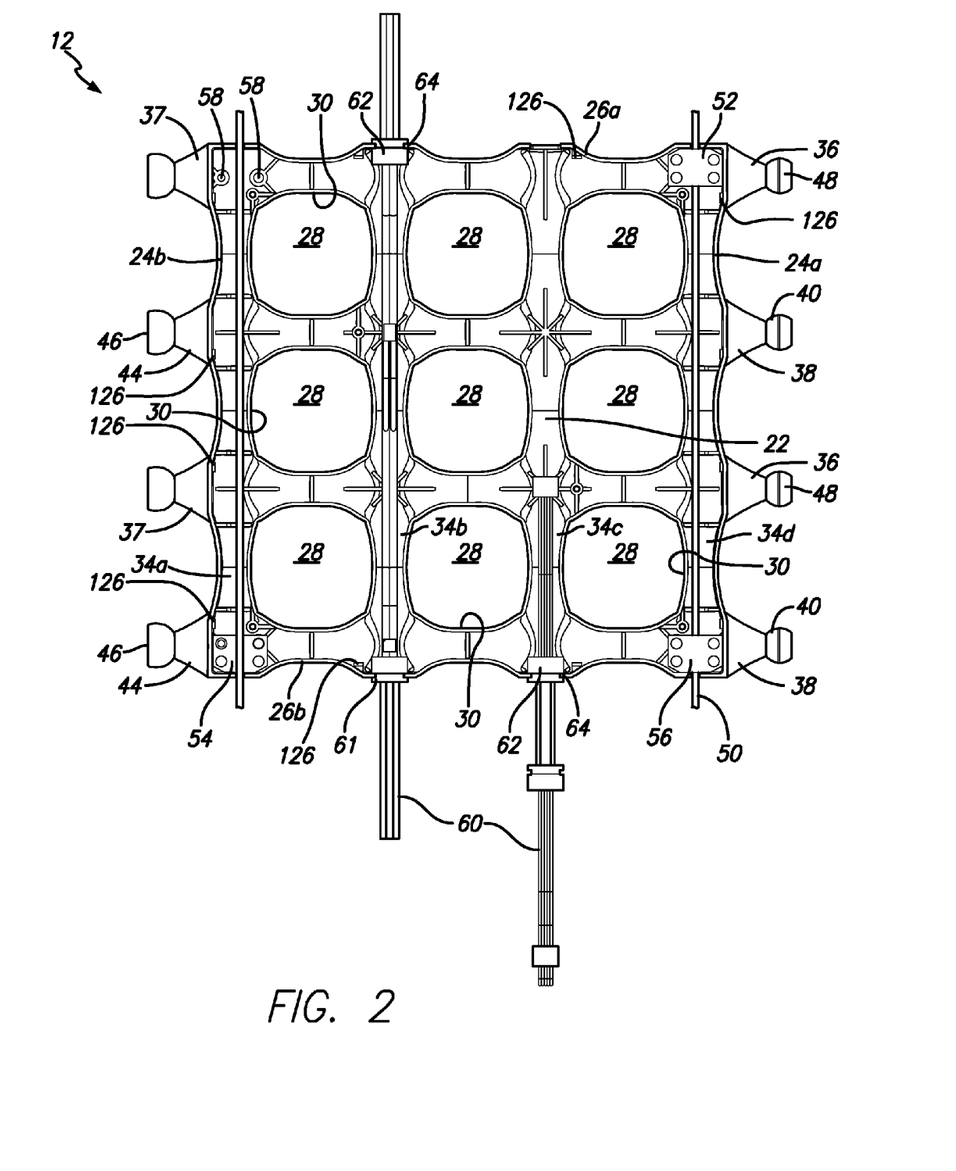
FIG. 2 is a front elevation view of a housing shell and related components for the modular light emitting display shown in FIG. 1.

As seen, for example, in FIG. 2, a front elevation view of the shell 12 and related components, the shell has a bottom 22, a first pair of opposing sidewalls 24a and 24b and a second pair of opposing sidewalls 26a and 26b. Each of the sidewalls of the first pair has substantially the same length as the other sidewall of the first pair. And each of the sidewalls of the second pair has substantially the same length as the other sidewall of the second pair.

A plurality of openings 28 having opening sidewalls 30 are formed in the bottom of the shell 12. The openings, along with sidewalls 24a and 24b, define a plurality of channels extending from sidewall 26a to sidewall 26b. In the representative embodiment shown in FIGS. 1 and 2, nine equally spaced side openings, along with the housing shell sidewalls 24a and 24b create four equally spaced channels 34a-d.

Figure 3:
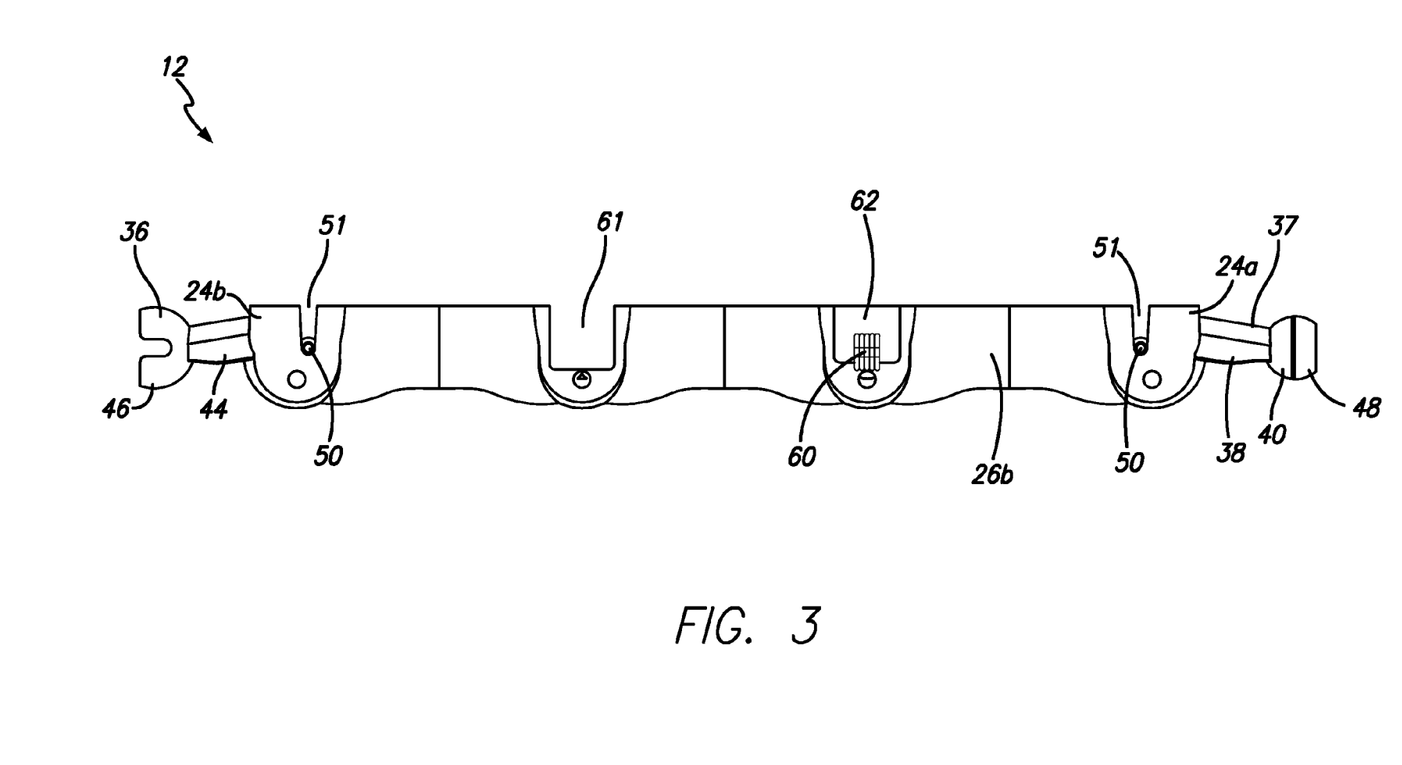
FIG. 3 is a first side elevation view of the housing shell and related components shown in FIG. 2.
Figure 4A:
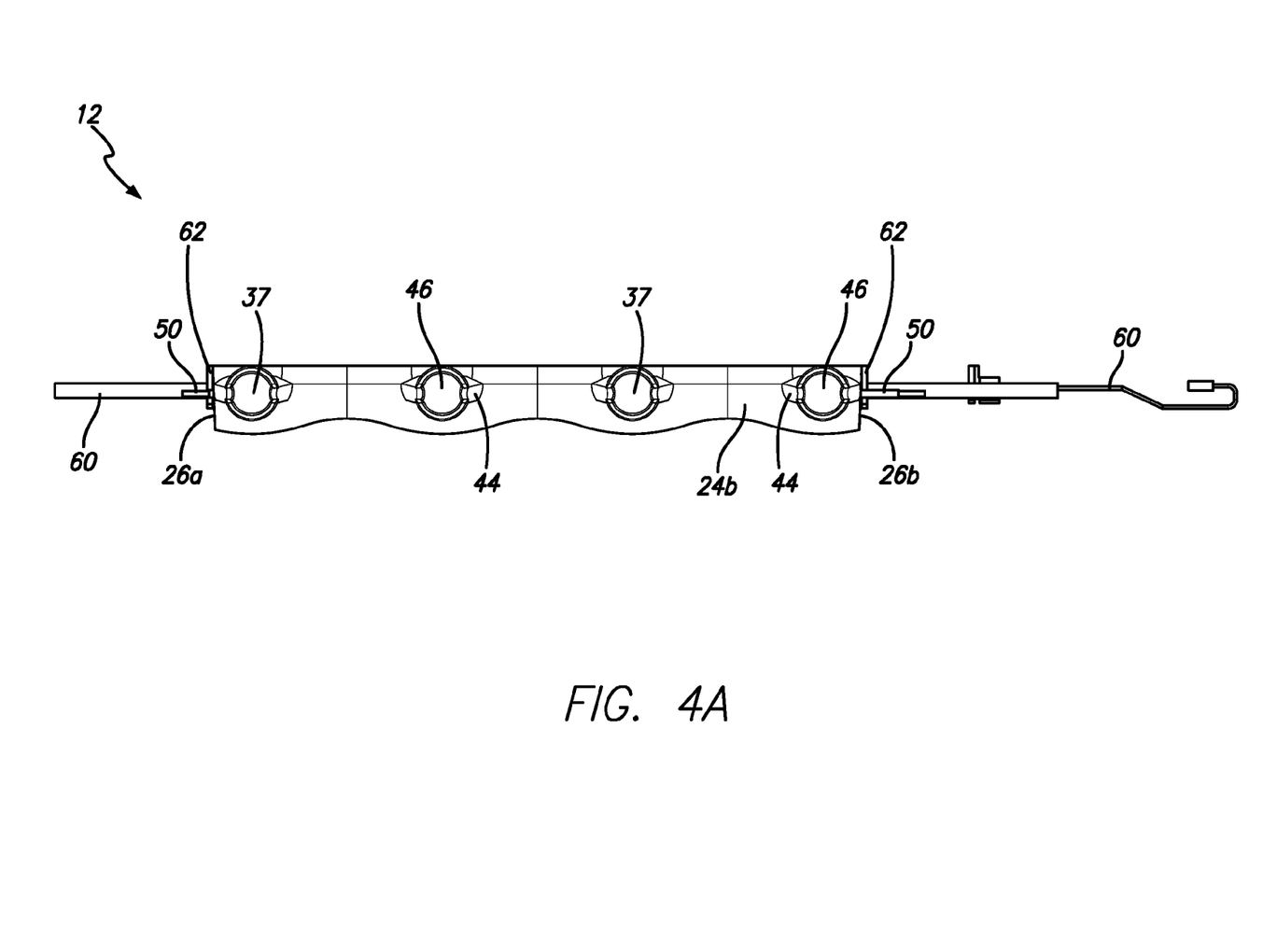
FIG. 4A is second side elevation view of the housing shell and related components shown in FIG. 2.
Figure 4B:
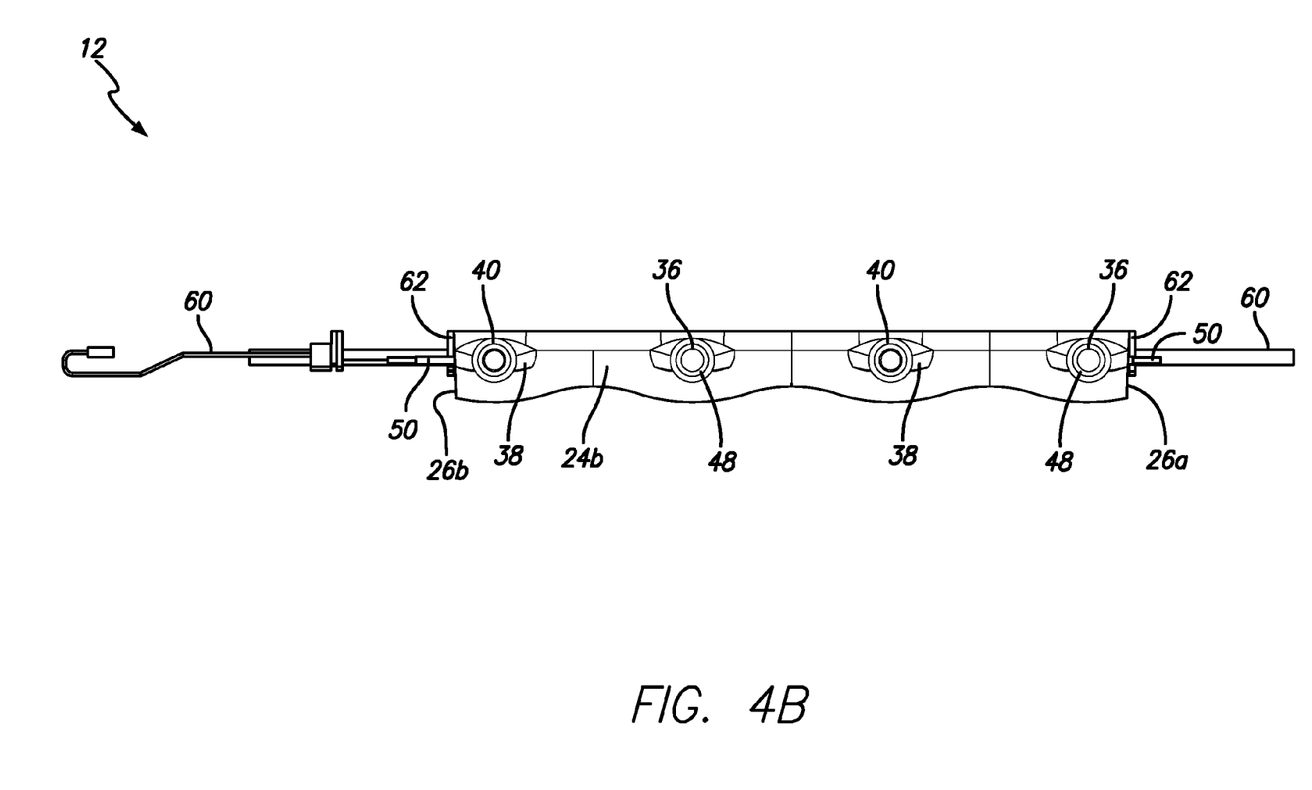
FIG. 4B is third side elevation view of the housing shell and related components shown in FIG. 2.

Turning additionally to FIG. 3, a first side elevation view, FIG. 4A, a second side elevation view, and FIG. 4B, a third side elevation view, in some aspects, at least one connector 36 extends outwardly from sidewall 24a, while at least one reciprocal connector 37 extends outwardly from sidewall 24b. In the representative embodiment shown in FIGS. 1-7, four connectors extend outwardly from sidewall 24a, and four corresponding reciprocal connectors extend outwardly from sidewall 24b. The spacing between the connectors is the same as the spacing between the reciprocal connectors and each of the reciprocal connectors is configured to mate with a corresponding connector on an adjacent display as shown in FIGS. 6A-C and 7. It is a distinct advantage of the invention that the connectors not only connect adjacent panels, but also serve to space adjacent panels from one another by a predetermined distance corresponding to the length of the mated connectors.

In one aspect of the invention, the connectors 36 are ball connectors configured to mate with socket connectors 37. In the representative embodiment shown in FIGS. 1-4B, the ball connectors comprise a wedge-shaped base 38 having a truncated ball 40 at its distal end and the reciprocal connectors 37 comprises a wedge-shaped base 44 having socket 46 at its distal end. In some embodiments, the surface of the ball includes as coating 48, such as a Teflon coating, to facilitate the movement of the ball in the socket.

As seen in FIG. 2, a pair of support wires 50 extend through substantially linear support wire channels 34a and 34d, respectively, and pass through notches 51 (best seen in FIG. 3) in the ends of the portion of opposing sidewalls 26a and 26b that terminate channels 34a and 34d, respectively. Representative support wires include metal wires, strands, cables, ropes and the like.

Figure 5:
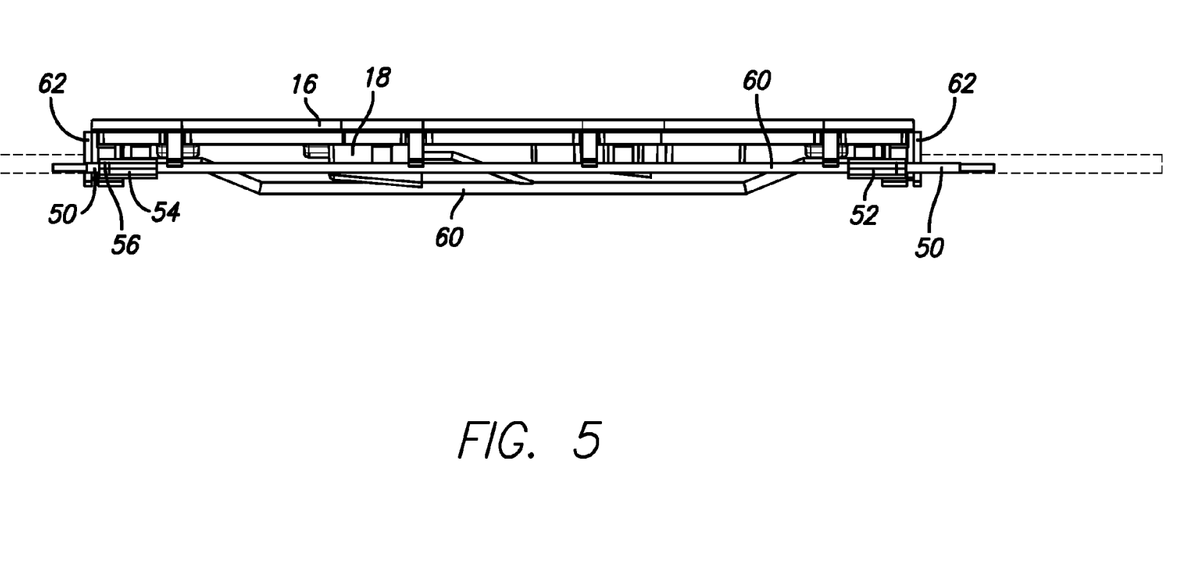
FIG. 5 is broken away, side elevation view of modular light emitting display shown in FIG. 1.

In some aspects of the invention, the support wires are attached to the housing 11 using support wire fasteners. In the representative embodiment shown in FIGS. 2 and 5, the support wires are fastened to the housing with four wire clamps 52 (portions of three claims shown in FIG. 2) positioned at each end of channels 34a and 34d. Referring additionally to FIG. 5, each clamp is formed of a bottom hold plate 54 and a top hold plate 56. Each hold plate is self screwing and attached to bores 58 in the housing shell.

In one aspect of the invention, electrical power and data cables 60 extend through cable channels 34b and 34c, respectively, and pass through notches 61 (best seen in FIG. 3) in the ends of the portion of opposing sidewalls 26a and 26b that terminate channels 34b and 34c, respectively. As seen in FIG. 2, each cable has at least one connection portion 62, which includes a pair of opposing notches 64. The opposing notches are dimensioned to fit into notches 61 and notches 68 aligned with notches 61 in the printed circuit board base 18 (FIG. 1).

In an aspect of the invention, the PCB 14 has a top surface 70. Operably connected to the top surface of the PCB is a plurality of light emitting elements 72. Representative light emitting elements 72 include LEDs, LCDs, OLEDs and the like. In some embodiments, an array of from 1 to 1250 light emitting elements such as LEDs is formed on the top surface 70 of the PCB 14 while in some embodiments, an array of from 9 to 500 light emitting elements such as LEDs is formed on the top surface, and in some embodiments and array of from 16 to 250 light emitting elements such as LEDs is formed on the top surface. A plurality of holes 74, each hole aligned with one of the light emitting elements 72, are formed in the cover 16.

The components of the housing 11 can be secured to one another using any suitable method. In some aspects, the cover 16 is removably secured to the shell 12 to permit easy access to the PCB 14. In the representative embodiment shown in FIG. 1, cover 16 contains a bottom surface 110, a top surface 112, a first pair of opposing sides 114a and 114b, and a second pair of opposing sides 116a and 116b. A plurality of attachment barbs 120 extending downwardly from the bottom surface along each of the opposing sides. The barbs pass through aligned notches 122 and 124, in the PCB and PCB base, respectively, and are engaged by aligned flanges 126 extending inwardly from the opposing sides 22a, 22b and 24a and 26b of the base 12 (best seen in FIG. 2) when the cover is fastened to the base.

Figure 6A:
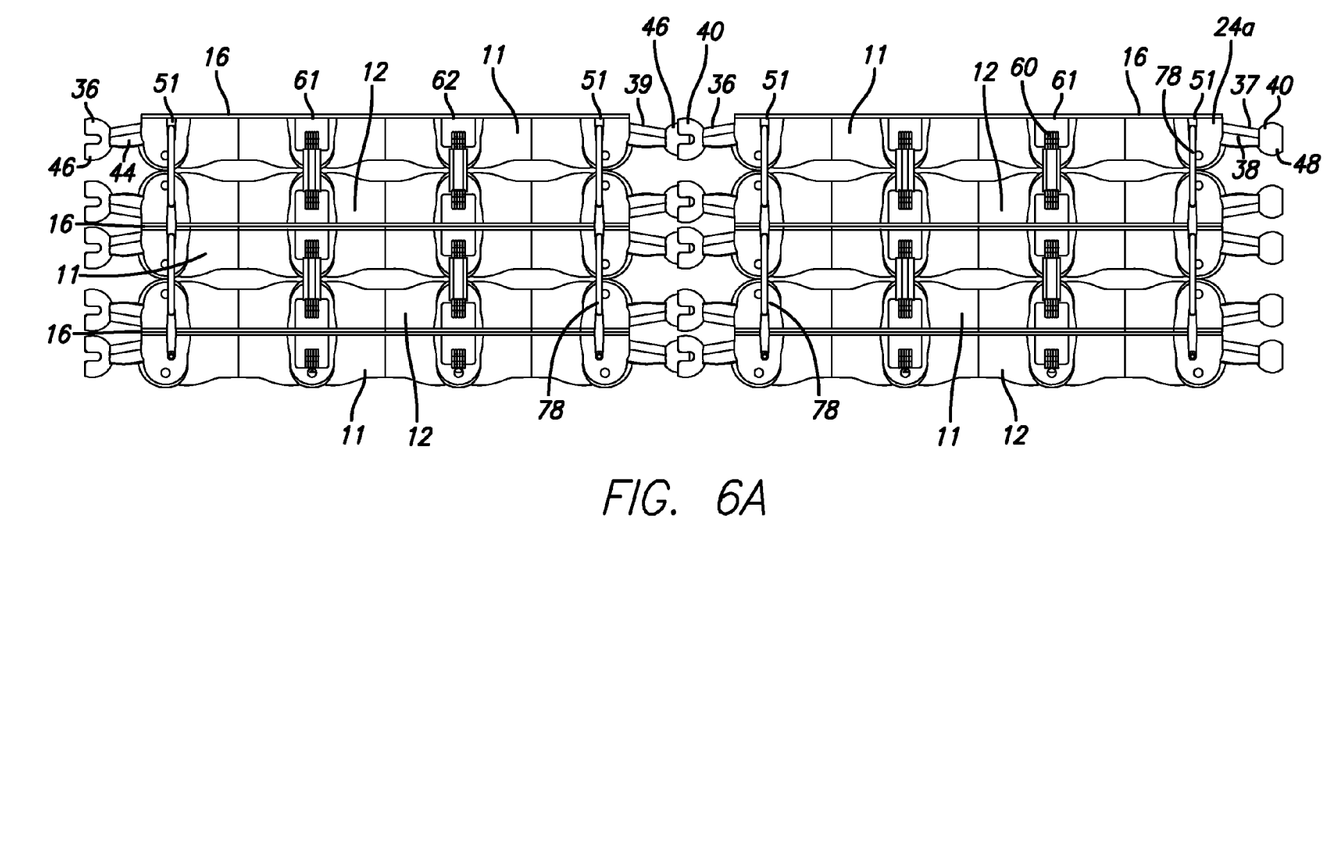
FIG. 6A is a front plan view of an array of ten modular light emitting displays in accordance with one aspect of the invention in a collapsed position.
Figure 6B:
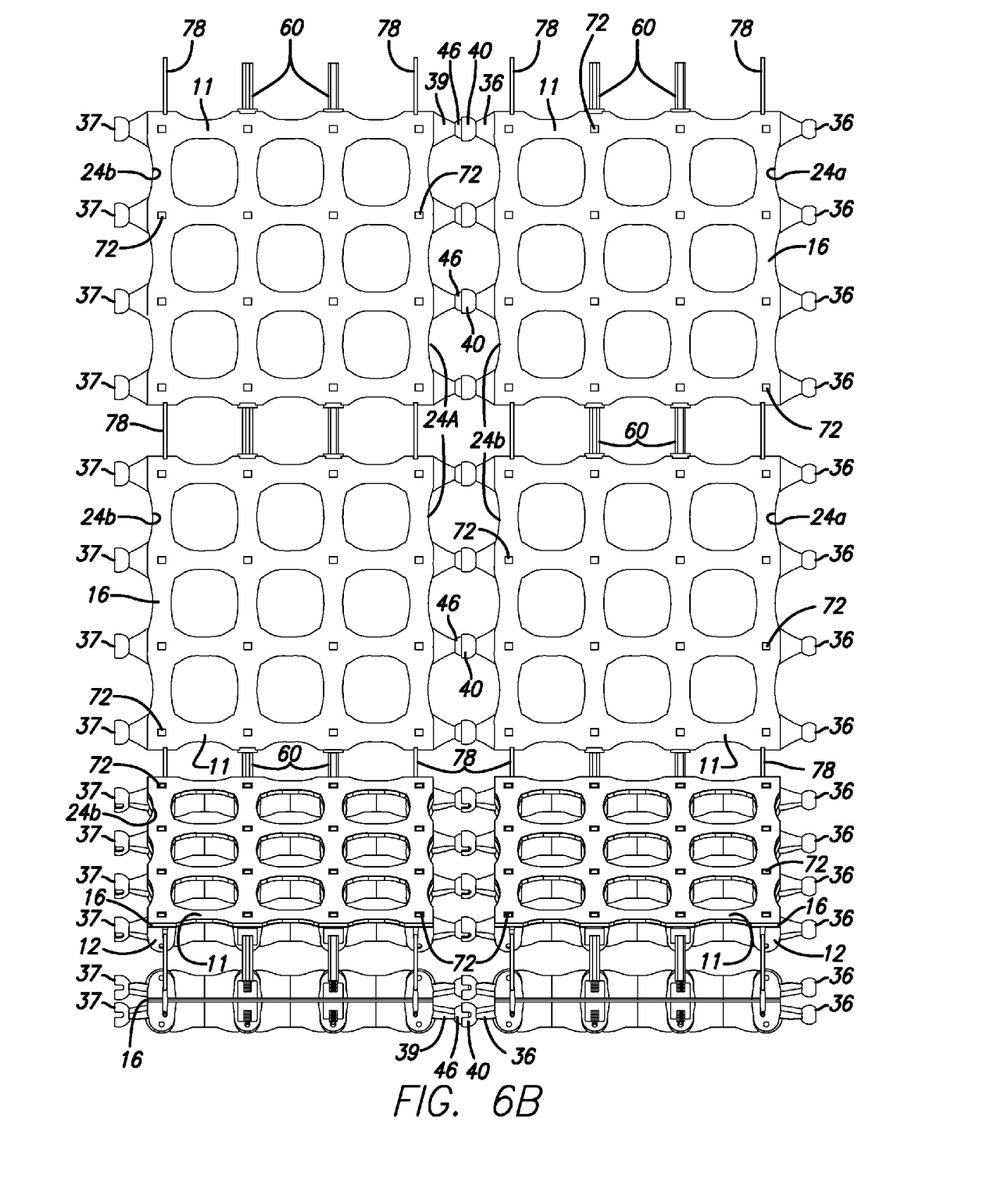
FIG. 6B is a front plan view of the array of the ten modular light emitting displays shown in FIG. 6A in a partially extended position.
Figure 6C:
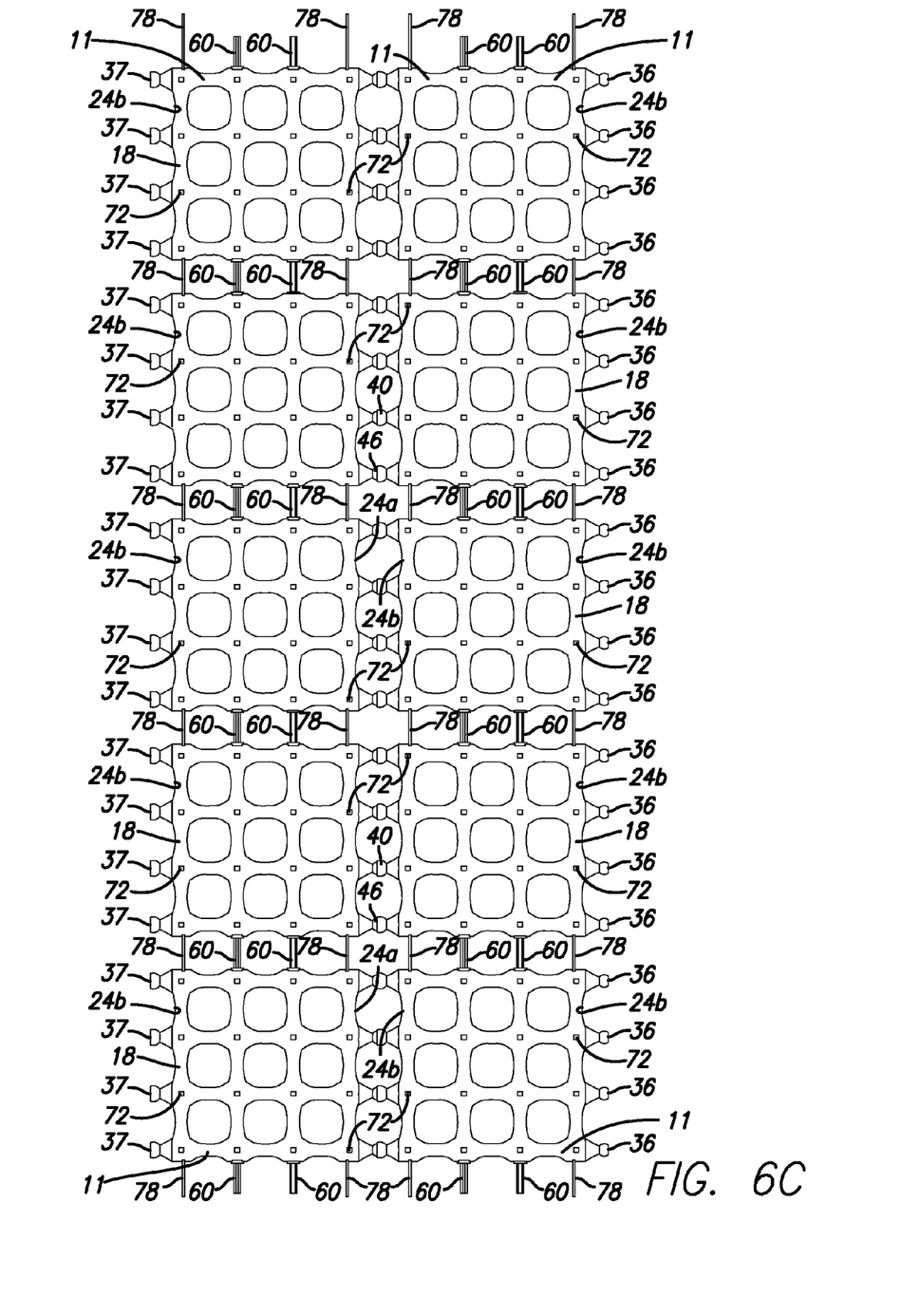
FIG. 6C is a front plan view of the array of the ten modular light emitting displays shown in FIG. 6A in a fully extended position.

Shown in FIGS. 6A-C is an aspect of the invention in which a modular light emitting display array 76 comprises a two-by-five array of modular light emitting displays 11. However, it is another distinct of the advantage of the invention that the number of displays in both the vertical and horizontal directions can be varied by the user to meet the needs of a specific application.

The modular light emitting displays are connected to one another in the vertical direction by a plurality of continuous wires 78, i.e., single wires that extend through and support each of the displays in a vertical column of the array. In the specific embodiment shown in FIGS. 6A-C, two wires are used to support each display. However, in other embodiments, one or more continuous wires can be used. The displays are connected to one another in the horizontal direction by mating the balls 40 of connectors 36 on the side 24a of a first modular light emitting display with the sockets 46 of connectors 37 on the side 27b of an adjacent modular light emitting display. In the specific embodiment, shown in FIGS. 6A-C, four connectors and four mating connectors are used to connect each display. However, in other embodiments, one or more connector and one or more reciprocal connector can be used.

Figure 7:
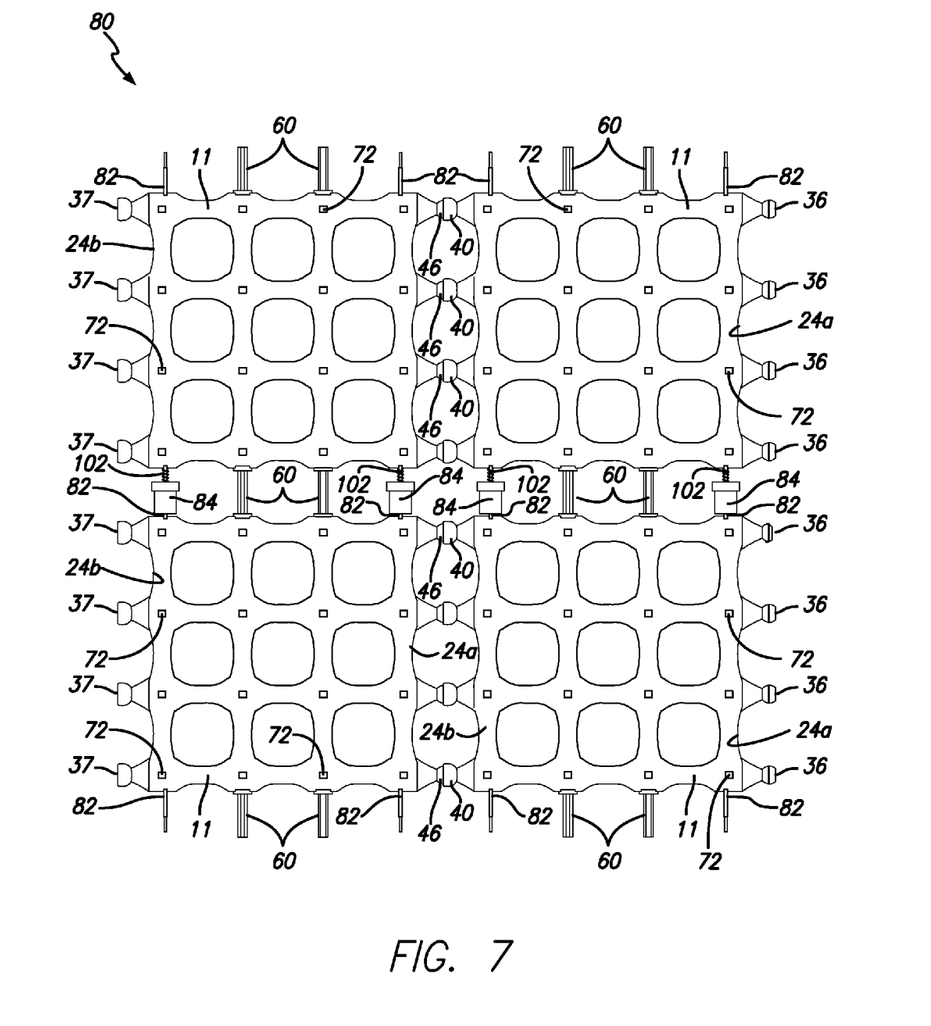
FIG. 7 is a front plan view of an array of four modular light emitting displays in accordance with another aspect of the invention.
Figure 8:
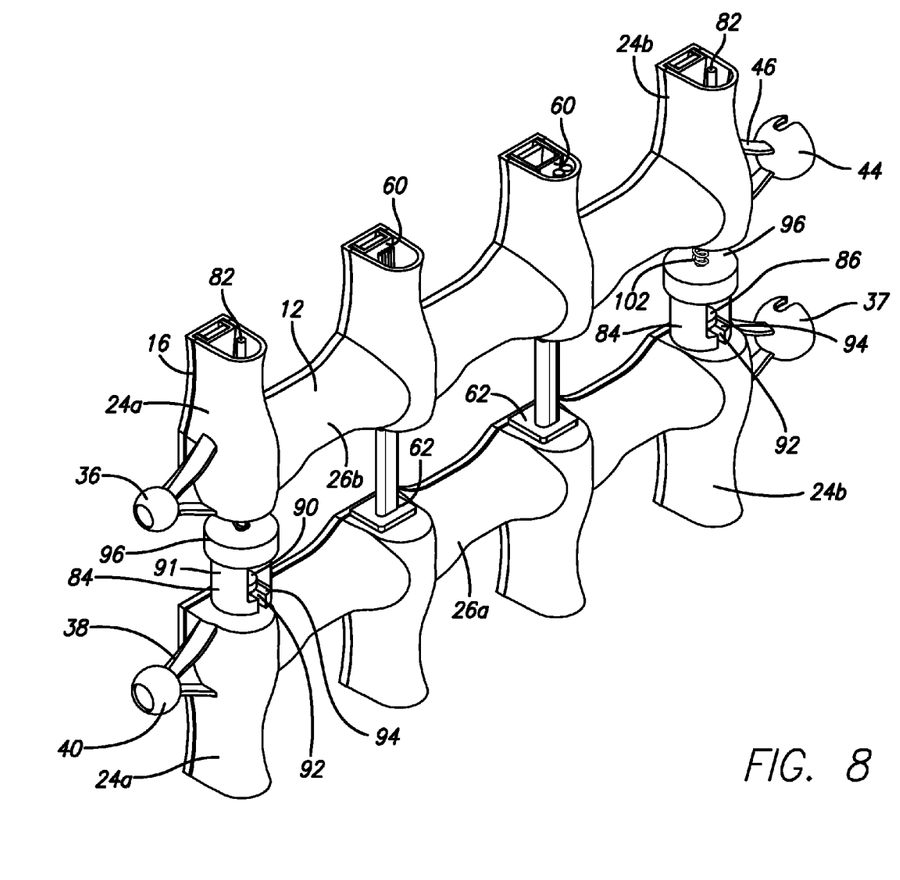
FIG. 8 is a back perspective view of a portion of an array of two modular light emitting displays.
Figure 9:
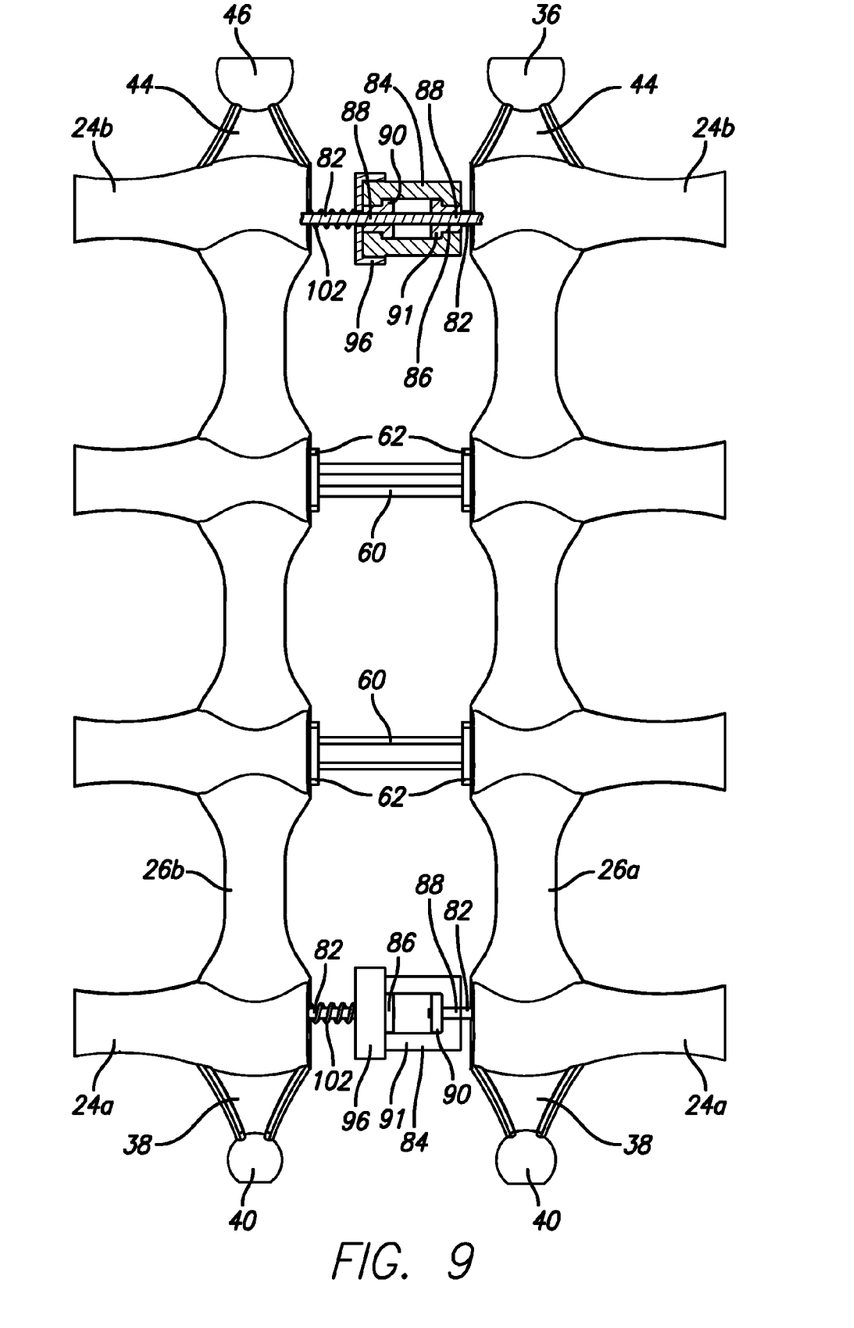
FIG. 9 is a back plan view of the portion of portion of the array of two modular light emitting displays shown in FIG. 8.

The length of each wire 78 and each cable 60 extending between adjacent displays 11 is the same. It is a length sufficient to allow the display to be folded back upon itself in the collapsed zigzag configuration shown in FIG. 6A. Shown in FIG. 6B is the array in a partially extended position, while shown in FIG. 6C is the array in a completely extended position Another aspect of the invention is illustrated in FIGS. 7-9. Shown in FIG. 7 is a representative embodiment of a modular light emitting display assembly 80 comprising a two-by-two array of modular light emitting displays 11 connected to one another in the vertical direction by a plurality of wires 82 attached of one another by wire connectors 84.

Details of the wire connectors 84 are best seen in FIGS. 8 and 9. Each wire 82 terminates in an end cap 86 having a shank 88 and a head 90. Each wire connector includes a body 91 having a top and a bottom. A pair of longitudinal end cap openings 92 configured to receive the shank of an end cap extends into the body from the top and bottom, respectively. A pair of cap contact surfaces 94 configured to abut each end cap head, when an end cap is inserted in a wire connector are formed in the connector body at end of each end cap opening.

In some aspects, an end cover 96 is secured over the top of the end cap. In the representative embodiment shown in FIG. 9 the end cover is removably secured to the end cap by screw threads configured to mate with complementary screw threads on the top of the connector body.

And in some aspects, a compression spring 102 surrounding a portion of each wire is disposed between the side of the modular light emitting display and top of the end cover.

In the foregoing specification, various aspects of the invention have been described with reference to specific exemplary embodiments. Various modifications and changes may be made, however, without departing from the scope of the present invention. The specification and figures are illustrative, rather than restrictive, and modifications are intended to be included within the scope of the present invention. Accordingly, the scope of the invention should be determined by the claims and their legal equivalents rather than by merely the examples described. With regard to particular embodiments described above, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

We claim:

1. A modular light emitting display comprising:
  a housing comprising:
    a bottom,
    a top,
    a first pair of opposing sidewalls, each of the sidewalls of the first pair having substantially the same length as the other sidewall of the first pair;
    a second pair of opposing sidewalls, each of the sidewalls of the second pair having substantially the same length as the other sidewall of the second pair;
    at least one first support wire opening in one of the sidewalls of the second pair of sidewalls and at least one second support wire opening in the other sidewall of the second pair of sidewalls, the at least one first support wire opening aligned with the at least one second support wire opening;
    at least one support wire fastener disposed inside the housing, the at least one support wire fastener aligned with the at least one first support wire opening and the at least one second support wire opening;
  a printed circuit board having a top surface disposed inside the housing;
  a plurality of light emitting elements operably connected to the top surface of the printed circuit board and the housing top having a hole aligned with each of the plurality of light emitting elements;
  at least one connector extending outwardly from one of the sides of the first pair of sides; and
  at least one reciprocal connector extending outwardly from the other of the side of the first pair of sides, the at least one connector and the at least one reciprocal connector spaced the same distance from second pair of opposing sides.

2. The modular light emitting display of claim 1 wherein the housing has a substantially square or rectangular cross section.

3. The modular light emitting display of claim 1 wherein the housing has a substantially square cross section.

4. The modular light emitting display of claim 1 wherein the housing comprises a shell having a cover.

5. The modular light emitting display of claim 4 wherein the cover is removable.

6. The modular light emitting display of claim 1 wherein each connector is a ball connector and each reciprocal connector is a socket connector.

7. The modular light emitting display of claim 1 wherein the printed circuit board is mounted on a printed circuit board base disposed in the housing.

8. The modular light emitting display of claim 1 wherein the at least one light emitting element is an LED, an LCD or an OLED.

9. The modular light emitting display of claim 1 wherein the at least one light emitting element is an LED.

10. The modular light emitting display of claim 1 further comprising at least one support wire channel extending from one sidewall of the second pair of opposing sidewalls to the opposing sidewall of the second pair of sidewalls, the at least one wire support channel having a first end and a second end, the first end terminating at the at least one first support wire opening and the second end terminating at the at least one second support wire opening, where the at least one support wire fastener is disposed in the at least one support wire channel.

11. The modular light emitting display of claim 1 further comprising at least one cable channel extending from one sidewall of the second pair of opposing sidewalls to the opposing sidewall of the second pair of sidewalls, the at least one cable channel having a first end and a second end, the first end terminating at a first cable opening and the second end terminating at a second cable opening.

12. The modular light emitting display of claim 1 wherein the support wire fastener is a support wire clamp.

13. The modular light emitting display of claim 1 further comprising a support wire clamp disposed at the first and second ends of the at least one wire support channel.

14. A modular light emitting display comprising:
  a housing comprising:
    a bottom,
    a top,
    a first pair of opposing sidewalls, each of the sidewalls of the first pair having substantially the same length as the other sidewall of the first pair;
    a second pair of opposing sidewalls, each of the sidewalls of the second pair having substantially the same length as the other sidewall of the second pair;
      a plurality of pairs of first and second support wire openings, the first support wire openings in one of the sidewalls of the second pair of sidewalls and the second support wire openings in the other sidewall of the second pair of sidewalls, the first support wire opening of each pair aligned with the second wire support opening of each pair;
  a plurality of support wire fasteners disposed inside the housing, each support wire fastener aligned with a pair of support wire openings;
  a printed circuit board having a top surface disposed inside the housing;
  a plurality of light emitting elements operably connected to the top surface of the printed circuit board and the housing top having a hole aligned with each of the plurality of light emitting elements;
  a plurality of connectors extending outwardly from one of the sides of the first pair of sides, the plurality of connectors spaced from one another along the one side,
  an equal number of reciprocal connectors extending outwardly from the other of the side of the first pair of sides, each connector having a corresponding reciprocal connector and each connector and corresponding reciprocal connector spaced equally from second pair of opposing sides.

15. The modular light emitting display of claim 14 wherein the housing has a substantially square or rectangular cross section.

16. The modular light emitting display of claim 14 wherein the housing has a substantially square cross section.

17. The modular light emitting display of claim 14 wherein the housing comprises a shell having a cover.

18. The modular light emitting display of claim 17 wherein the cover is removable.

19. The modular light emitting display of claim 14 wherein each connector is a ball connector and each reciprocal connector is a socket connector.

20. The modular light emitting display of claim 14 wherein the printed circuit board is mounted on a printed circuit board base disposed in the housing.

21. The modular light emitting display of claim 14 wherein the at least one light emitting element is an LED, an LCD or an OLED.

22. The modular light emitting display of claim 14 wherein the at least one light emitting element is an LED.

23. The modular light emitting display of claim 14 further comprising a plurality of support wire channels, each support wire channel extending from one of the first support wire openings of a pair of support openings to the second support wire opening of the pair of support wire openings, where at least one of the support wire fasteners is disposed in each support wire channel.

24. The modular light emitting display of claim 14 further comprising at least one cable channel extending from one sidewall of the second pair of opposing sidewalls to the opposing sidewall of the second pair of sidewalls, the at least one cable channel having a first end and a second end, the first end terminating at a first cable opening and the second end terminating at a second cable opening.

25. The modular light emitting display of claim 14 wherein the support wire fastener is a support wire clamp.

26. The modular light emitting display of claim 14 further comprising a support wire clamp disposed at the first and second ends of the at least one wire support channel.

27. A modular light emitting display comprising:
a housing comprising:
a bottom,
a top,
a first pair of opposing sidewalls, each of the sidewalls of the first pair having substantially the same length as the other sidewall of the first pair;
a second pair of opposing sidewalls, each of the sidewalls of the second pair having substantially the same length as the other sidewall of the second pair;
a printed circuit board having a top surface disposed inside the housing;
a plurality of light emitting elements operably connected to the top surface of the printed circuit board and the housing top having a hole aligned with each of the plurality of light emitting elements;
a plurality of ball connectors extending outwardly from one of the sides of the first pair of sides, the plurality of ball connectors spaced from one another along the one side,
an equal number of reciprocal socket connectors extending outwardly from the other of the side of the first pair of sides, each ball connector having a corresponding reciprocal socket connector and each connector and corresponding reciprocal connector spaced equally from second pair of opposing sides.

28. The modular light emitting display of claim 27 wherein the housing has a substantially square or rectangular cross section.

29. The modular light emitting display of claim 27 wherein the housing has a substantially square cross section.

30. The modular light emitting display of claim 27 wherein the housing comprises a shell having a cover.

31. The modular light emitting display of claim 30 wherein the cover is removable.

32. The modular light emitting display of claim 27 wherein the printed circuit board is mounted on a printed circuit board base disposed in the housing.

33. The modular light emitting display of claim 27 wherein the at least one light emitting element is an LED, an LCD or an OLED.

34. The modular light emitting display of claim 27 wherein the at least one light emitting element is an LED.

35. An array of modular light emitting displays comprising:
at least two light emitting adjacent displays, each light emitting display comprising:
a housing including:
a bottom,
a top,
a first pair of opposing sidewalls, each of the sidewalls of the first pair having substantially the same length as the other sidewall of the first pair;
a second pair of opposing sidewalls, each of the sidewalls of the second pair having substantially the same length as the other sidewall of the second pair;
at least one first support wire opening in one of the sidewalls of the second pair of sidewalls and at least one second support wire opening in the other sidewall of the second pair of sidewalls, the at least one first support wire opening aligned with the at least one second support wire opening; and
at least one support wire extending through the at least one first support wire opening and the at least second wire opening in each light emitting display, the at least one support wire securing adjacent light emitting displays.

36. The array of claim 35 wherein the light emitting displays are movable between collapsed and open positions.

37. The array of claim 35 further comprising at least one support wire fastener disposed in the housing.

38. The array of claim 37 wherein the support wire fastener is a support wire clamp.

39. The array of claim 35 further comprising a plurality of support wire channels, each support wire channel extending from one of the first support wire openings of a pair of support openings to the second support wire opening of the pair of support wire openings and wherein at least one of the support wire fasteners is disposed in each support wire channel.

40. The modular light emitting display of claim 9 comprising at least one support wire fastener disposed in the at least one support wire channel.

41. The modular light emitting display of claim 13 wherein the support wire fastener is a support wire clamp.

42. The modular light emitting display of claim 9 comprising a support wire claim disposed at the end of each support wire channel adjacent each support wire opening.

43. The array of claim 35 further comprising a plurality of connectors extending outwardly from one of the sides of the first pair of sides, the plurality of connectors spaced from one another along the one side, and an equal number of reciprocal connectors extending outwardly from the other of the side of the first pair of sides, each connector having a corresponding reciprocal connect and each connector and corresponding reciprocal connector spaced equally from second pair of opposing sides.

44. The array of claim 35 wherein the housing has a substantially square or rectangular cross section.

45. The array of claim 42 wherein the housing has a substantially square cross section.

46. The array of claim 35 wherein the housing comprises a shell having a cover.

47. The array of claim 44 wherein the cover is removable.

48. The array of claim 35 wherein each connector is a ball connector and each reciprocal connector is a socket connector.

49. The array of claim 35 further comprising a printed circuit board having a top surface disposed inside the housing and a plurality of light emitting elements operably connected to the top surface of the printed circuit board and the housing top having a hole aligned with each of the plurality of light emitting elements.

50. The array of claim 35 wherein the printed circuit board is mounted on a printed circuit board base disposed in the housing.

51. The array of claim 35 wherein the at least one light emitting element is an LED, an LCD or an OLED.

52. The array of claim 49 wherein the at least one light emitting element is an LED.

53. The array of claim 35 wherein the support wire fastener is a support wire clamp.

54. The array of claim 35 comprising a support wire clamp disposed at the first and second ends of the at least one wire support channel.

* * * * *